US009739801B2

(12) United States Patent
Anderson et al.

(10) Patent No.: US 9,739,801 B2
(45) Date of Patent: Aug. 22, 2017

(54) ANALYTICAL GATEWAY DEVICE FOR MEASUREMENT DEVICES

(71) Applicant: Fluke Corporation, Everett, WA (US)

(72) Inventors: Thomas Duffy Anderson, Everett, WA (US); David Lawrence Epperson, Everett, WA (US)

(73) Assignee: Fluke Corporation, Everett, WA (US)

( * ) Notice: Subject to any disclaimer, the term of this patent is extended or adjusted under 35 U.S.C. 154(b) by 947 days.

(21) Appl. No.: 13/943,736

(22) Filed: Jul. 16, 2013

(65) Prior Publication Data

US 2015/0022181 A1    Jan. 22, 2015

(51) Int. Cl.
*G01R 15/00*    (2006.01)
*G01R 21/00*    (2006.01)
(Continued)

(52) U.S. Cl.
CPC .............. *G01R 1/30* (2013.01); *G01R 15/125* (2013.01); *G06F 9/5005* (2013.01); *H04Q 9/00* (2013.01); *H04L 67/12* (2013.01); *H04Q 2209/40* (2013.01)

(58) Field of Classification Search
CPC ...... G01R 1/30; G01R 15/125; G01R 21/133; G01R 19/2513; G01R 15/09; G01R 23/02;
(Continued)

(56) References Cited

U.S. PATENT DOCUMENTS 5,386,117 A    1/1995 Piety et al.
5,637,871 A    6/1997 Piety et al.
(Continued)

FOREIGN PATENT DOCUMENTS

CA    2152024 A1    12/1995
EP    2026079 A2 *    2/2009    ........... G01R 15/002
(Continued)

OTHER PUBLICATIONS

"Fluke CNX Wireless System," Technical Data, Fluke CNX 3000 Series Test Tools., Fluke Corporation, Everett, Wash., © 2012-2013, <http://support.fluke.com/find-sales/Download/Asset/4237028_6116_ENG_D_W.PDF> [document dated Apr. 2013] [retrieved Jul. 3, 2013], 11 pages.
(Continued)

*Primary Examiner* — Mohamed Charioui
*Assistant Examiner* — Leonard S Liang
(74) *Attorney, Agent, or Firm* — Seed IP Law Group LLP (57) ABSTRACT

An analytical gateway device receives measurement data comprising one or more measurement values from one or more measurement devices. The gateway device selects a measurement application from a plurality of measurement applications available for execution (e.g., on the gateway device or some other computing device) based at least in part on the measurement data. For example, the measurement application can be selected based on measurement type information. The measurement type information may include one or more measurement units associated with the measurement values. The gateway device may cause a user interface (or some other information) associated with the measurement application to be presented on a display (e.g., a display of the gateway device or some other computing device in communication with the gateway device).

22 Claims, 9 Drawing Sheets (51) Int. Cl.
*G01R 21/06* (2006.01)
*G06F 11/00* (2006.01)
*G01R 1/30* (2006.01)
*G01R 15/12* (2006.01)
*G06F 9/50* (2006.01)
*H04Q 9/00* (2006.01)
*H04L 29/08* (2006.01)

(58) Field of Classification Search
CPC ...... G01R 13/208; G01R 29/18; G01R 25/00; G01R 11/40; G01R 11/42; G06F 9/5005; G06F 17/5036; G06F 19/2513; H04O 9/00; H04O 2209/40; H04L 67/12; G05B 23/02; G06Q 10/06; G01D 7/002; H03M 1/00; H03M 2201/4135
See application file for complete search history.

(56) References Cited

U.S. PATENT DOCUMENTS

| | | | |
|---|---|---|---|
| 5,664,207 A | 9/1997 | Crumpler et al. | |
| 6,043,640 A * | 3/2000 | Lauby | G01R 15/125 |
| | | | 324/117 H |
| 6,601,111 B1 | 7/2003 | Peacock | |
| 6,734,658 B1 * | 5/2004 | Bierer | G01R 15/14 |
| | | | 324/107 |
| 7,076,239 B2 | 7/2006 | Kirkup et al. | |
| 7,191,184 B2 | 3/2007 | Laborde et al. | |
| 7,304,618 B2 | 12/2007 | Plathe | |
| 7,454,050 B2 | 11/2008 | Garvey | |
| 7,478,305 B2 | 1/2009 | Betawar et al. | |
| 7,528,372 B2 | 5/2009 | Garvey, III et al. | |
| 7,552,029 B2 | 6/2009 | Elwood et al. | |
| 7,561,200 B2 | 7/2009 | Garvey, III et al. | |
| 7,679,356 B2 * | 3/2010 | Garland | G01R 15/002 |
| | | | 324/115 |
| 7,703,032 B2 | 4/2010 | Wells | |
| 7,706,596 B2 | 4/2010 | Garvey | |
| 7,728,275 B2 | 6/2010 | Blanchard | |
| 7,902,507 B1 | 3/2011 | Garvey, III et al. | |
| 7,960,965 B2 * | 6/2011 | Lund | G01R 15/125 |
| | | | 324/115 |
| 7,995,830 B2 | 8/2011 | Garvey | |
| 8,003,942 B2 | 8/2011 | Garvey, III et al. | |
| 8,119,986 B1 | 2/2012 | Garvey, III et al. | |
| 8,124,923 B2 | 2/2012 | Blanchard | |
| 8,148,687 B1 | 4/2012 | Praly | |
| 8,300,922 B1 | 10/2012 | Garvey, III | |
| 8,334,513 B1 | 12/2012 | Garvey, III et al. | |
| 8,358,903 B1 | 1/2013 | Meads et al. | |
| 8,368,001 B2 | 2/2013 | Blanchard | |
| 8,447,541 B2 | 5/2013 | Rada et al. | |
| 8,754,779 B2 | 6/2014 | Ruther | |
| 8,976,039 B2 | 3/2015 | O'Hara et al. | |
| 2001/0038343 A1 | 11/2001 | Meyer et al. | |
| 2004/0249605 A1 | 12/2004 | Komatsu | |
| 2005/0035966 A1 | 2/2005 | Pasquarette et al. | |
| 2005/0125512 A1 | 6/2005 | Fuller et al. | |
| 2006/0071812 A1 | 4/2006 | Mason et al. | |
| 2007/0118323 A1 | 5/2007 | Ishizuka | |
| 2007/0176933 A1 | 8/2007 | Culpi et al. | |
| 2008/0231719 A1 | 9/2008 | Benson et al. | |
| 2009/0128124 A1 * | 5/2009 | Garland | G01R 15/125 |
| | | | 324/115 |
| 2009/0128125 A1 * | 5/2009 | Garland | G01R 15/125 |
| | | | 324/115 |
| 2009/0128126 A1 * | 5/2009 | Garland | G01R 15/125 |
| | | | 324/115 |
| 2009/0141593 A1 | 6/2009 | Taha | |
| 2010/0070273 A1 * | 3/2010 | Rodriguez | G10L 15/26 |
| | | | 704/231 |
| 2010/0167659 A1 | 7/2010 | Wagner | |
| 2010/0181990 A1 * | 7/2010 | Hudson | G01R 15/125 |
| | | | 324/115 |
| 2011/0099424 A1 | 4/2011 | Rivera Trevino et al. | |
| 2011/0137678 A1 | 6/2011 | Williams | |
| 2011/0288810 A1 | 11/2011 | Ishikawa et al. | |
| 2012/0001768 A1 * | 1/2012 | Radosavljevic | H04Q 9/00 |
| | | | 340/870.03 |
| 2012/0004886 A1 | 1/2012 | Jordil et al. | |
| 2012/0030547 A1 | 2/2012 | Raptis | |
| 2012/0047424 A1 | 2/2012 | Rothschild | |
| 2012/0079504 A1 | 3/2012 | Maciocci | |
| 2012/0130223 A1 | 5/2012 | Reicher | |
| 2012/0154172 A1 | 6/2012 | O'Hara et al. | |
| 2012/0172023 A1 | 7/2012 | Griff et al. | |
| 2012/0178438 A1 | 7/2012 | Vashi et al. | |
| 2012/0224067 A1 | 9/2012 | Stuart et al. | |
| 2012/0229270 A1 | 9/2012 | Morley et al. | |
| 2012/0270505 A1 | 10/2012 | Prakash et al. | |
| 2012/0300089 A1 | 11/2012 | Sbaiz et al. | |
| 2012/0320189 A1 | 12/2012 | Stuart et al. | |
| 2013/0009788 A1 | 1/2013 | Langenberg et al. | |
| 2013/0024783 A1 | 1/2013 | Brakensiek et al. | |
| 2013/0029683 A1 | 1/2013 | Kim et al. | |
| 2013/0065633 A1 | 3/2013 | Sridhara et al. | |
| 2013/0066576 A1 | 3/2013 | Cs et al. | |
| 2013/0124136 A1 | 5/2013 | Neeley et al. | |
| 2013/0127904 A1 | 5/2013 | Dove et al. | |
| 2013/0307992 A1 | 11/2013 | Erlandsson et al. | |
| 2014/0039838 A1 * | 2/2014 | Katz | G01R 1/04 |
| | | | 702/188 |
| 2014/0149064 A1 | 5/2014 | Davidson | |
| 2014/0266765 A1 | 9/2014 | Neeley et al. | |
| 2014/0278255 A1 * | 9/2014 | Anderson | G01M 99/00 |
| | | | 702/189 |
| 2014/0279443 A1 | 9/2014 | Neeley et al. | |

FOREIGN PATENT DOCUMENTS

| | | |
|---|---|---|
| KR | 10 2008 0112692 A | 12/2008 |
| KR | 10 2012 0065540 A | 6/2012 |
| KR | 10 2012 0077332 A | 7/2012 |
| WO | 03/088830 A1 | 10/2003 |
| WO | 2010/076384 A8 | 7/2010 |
| WO | 2013/020110 A2 | 2/2013 |
| WO | 2013/020110 A3 | 2/2013 |

OTHER PUBLICATIONS

"Full Wireless Weather Station: Model No. WMR80A," Oregon Scientific, Inc., Tualatin, Oreg., <http://www.oregonscientific.com/us/en/Full-Wireless-Weather-Station-WMR80A-P> [retrieved Nov. 5, 2013], 2 pages.

"Wireless Full Weather Station Kit: Model WMR80/WMR80A User Manual," Oregon Scientific, Inc., Tualatin, Oreg., Jul. 2008, 13 pages.

Extech Instruments, "Extech EX540 Wireless Datalogging selected as 2010 EC&M Product of the Year Category Winner," Press Release, Mar. 18, 2009, 2 pages.

Extech Instruments, "Extech EX845 METERLiNK™ Clamp Meter Transmit Readings to FLIR IR Cameras," Press Release, Apr. 1, 2010, 3 pages.

Extech Instruments, "MultiMeter/Datalogger with Wireless PC Interface," Product Datasheet, Jul. 14, 2011, 1 page.

Extech Instruments, "Wireless TRMS Multimeter—Model EX540," User's Guide, Apr. 1, 2010, 17 pages.

International Search Report, mailed Jul. 10, 2014, for International Application No. PCT/US2014/029561, 2 pages.

International Search Report and Written Opinion, mailed Sep. 12, 2014, for International Application No. PCT/US2014/029867, 12 pages.

International Search Report and Written Opinion, mailed Jul. 24, 2014, for International Application No. PCT/US2014/029879, 12 pages.

International Search Report and Written Opinion, mailed Jul. 22, 2014, for International Application No. PCT/US2014/029883, 13 pages.

(56) References Cited

OTHER PUBLICATIONS

International Search Report and Written Opinion, mailed Jul. 18, 2014, for International Application No. PCT/US2014/029885, 16 pages.
International Search Report and Written Opinion, mailed Jul. 17, 2014, for International Application No. PCT/US2014/029889, 13 pages.
Bicelli, S., et al., "From the Traditional Multimeter to the 'Wireless Multimeter Networking,'" IEEE Instrumentation and Measurement Technology Conference (IMTC 2006), Sorrento, Italy, Apr. 24-27, 2006, pp. 1581-1586.
Extended European Search Report mailed Nov. 24, 2014, issued in corresponding European Application No. EP 14 175 986.0, filed Jul. 7, 2014, 10 pages.
"Microchip® / TC818A: Auto-Ranging Analog-to-Digital Converter With 3-½ Digit Display," Datasheet DS21475C, Oct. 31, 2005, Microchip Technology Inc., Chandler, Arizona, <http://ww1.microchip.com/downloads/en/DeviceDoc/21475C.pdf> [retrieved Nov. 13, 2014], pp. 1-24.
Extended European Search Report, mailed Oct. 21, 2016, for European Application No. 14765607.8-1855 / 2973486, 10 pages.
Communication pursuant to Article 94(3) EPC, dated Jun. 27, 2016, for European Application No. 14 175 986.0-1954, 7 pages.
Revolution Wi-Fi, "Wake on Wireless LAN," Nov. 8, 2010, retrieved from http://revolutionwifi.blogspot.de/2010/11/wake-on-wireless-lan.html, retrieved on Jun. 17, 2016, 5 pages.
Wikipedia, "Wake-on-LAN," retrieved from https://en.wikipedia.org/w/index.php?title=Wake-on-LAN&oldid=558487738, retrieved on Jun. 17, 2016, 9 pages.
Extended European Search Report, dated Nov. 25, 2016, for European Application No. 14764851.3-1568 / 2973071, 8 pages.

\* cited by examiner

ANALYTICAL GATEWAY DEVICE FOR MEASUREMENT DEVICES

BACKGROUND

When troubleshooting or installing machines and systems, technicians typically use handheld devices for basic fault finding and field service work. These devices can generally be used to troubleshoot electrical, mechanical, or other problems in, or confirm proper installation of, a wide array of industrial and household devices, such as electronic equipment, motor controls, domestic appliances, power supplies, and wiring systems. For proper diagnosis during troubleshooting, or when confirming proper installation of a device or system, technicians frequently make multiple measurements of various types, including voltage, current, resistance, and other measurements.

Recently, more extensive measurement functionality and data storage have been incorporated into handheld measurement tools. Some measurement tools are now capable of displaying readings from remote measurement modules and storing measured data. However, integration of multiple measurement modules into an overall measurement system remains difficult.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

In at least one embodiment of the present disclosure, an analytical gateway device receives first measurement data from at least one measurement device. The first measurement data comprises first measurement type information and a first measurement value. The gateway device selects a first measurement application from a plurality of measurement applications available for execution (e.g., on the gateway device or some other computing device) based at least in part on the first measurement type information. The first measurement type information may comprise a representation of a first measurement unit associated with the first measurement value. The gateway device may cause a user interface (or some other information) associated with the first measurement application to be presented on a display (e.g., a display of the gateway device or some other computing device).

The gateway device may receive second measurement data comprising a second measurement value and perform an operation based at least in part on the second measurement data. The operation may be based on second measurement type information included in the second measurement data. The operation may comprise execution of a second measurement application that differs from the first measurement application. Selection of the second measurement application may be based on a calculation, such as a comparison of a difference between the first measurement value and the second measurement value with a predetermined threshold. Execution of the second measurement application may include displaying information derived from the first measurement data and the second measurement data. For example, the displayed information may include power or energy information where the first measurement data comprises a voltage reading and the second measurement data comprises a current reading. The first and second measurement data may be received from different measurement devices or the same measurement device.

In another aspect, a gateway device receives measurement data from a measurement device, wherein the measurement data comprises a measurement data type, a measurement device type, an input type, or a measurement profile. The gateway device selects a measurement application from a plurality of measurement applications available for execution based at least in part on the measurement data. The selecting can be based on, for example, measurement type (e.g., current, AC voltage, DC voltage, time, temperature, resistance, pressure, flow rate, etc.) or measurement device type (e.g., current measurement device, voltage measurement device, temperature measurement device, resistance measurement device, pressure measurement device, flow measurement device, multimeter, etc.). The selected measurement application can be configured to permit at least partial control by the gateway device of the measurement device or other measurement device. For example, the selected measurement application may permit the gateway device to initiate a transition of the respective measurement device from a low-power state to an active state.

In another aspect, a measurement system comprises a plurality of measurement devices and a gateway device comprising: a wireless communication system configured to receive data from the plurality of measurement devices; a processor; and one or more computer-readable media having stored therein computer-executable instructions configured to cause the gateway device to: receive measurement data from at least one of the plurality of measurement devices, wherein the measurement data comprises measurement type information and a measurement value; and select a measurement application from a plurality of measurement applications available for execution based at least in part on the measurement type information. The measurement devices may include one or more digital multimeter devices.

DESCRIPTION OF THE DRAWINGS

The foregoing aspects and many of the attendant advantages will become more readily appreciated as the same become better understood by reference to the following detailed description, when taken in conjunction with the accompanying drawings, wherein.

DETAILED DESCRIPTION

Embodiments of the present disclosure are generally directed to an analytical gateway device that communicates with one or more measurement devices and selects appropriate measurement applications for execution based on data that is received from the measurement devices (e.g., measurement values, measurement types, etc.). The selected measurement applications can, for example, display received measurement values (e.g., in graph form), perform calculations on received measurement values, or perform other functionality. When different measurement data or updated measurement data is received, the gateway device can select new measurement applications for execution, as appropriate.

While various embodiments are illustrated and described, it will be appreciated that changes can be made therein without departing from the spirit and scope of the disclosure. Each embodiment described in this disclosure is provided merely as an example or illustration and should not be construed as preferred or advantageous over other embodiments. The illustrative examples provided herein are not intended to be exhaustive or to limit the disclosure to the precise forms disclosed. Additionally, it will be appreciated that embodiments of the present disclosure may employ any combination of the features described herein.

Prior to discussing the details of various aspects of the present disclosure, it should be understood that aspects of the following description may be presented in terms of logic and operations that may be performed by electronic components. These electronic components, which may be grouped in a single location or distributed over a wide area, generally include controllers, microcontrollers, control units, processors, microprocessors, etc. It will be appreciated by one skilled in the art that any logic described herein may be implemented in a variety of configurations, including but not limited to hardware, software, and combinations thereof. The hardware may include but is not limited to, analog circuitry, digital circuitry, processing units, application specific integrated circuits (ASICs), and the like, and combinations thereof. In circumstances in which the components of the system are distributed, the components are accessible to each other via communication links.

In general, functionality of devices described herein may be implemented in computing logic embodied in hardware or software instructions, which can be written in a programming language, such as C, C++, COBOL, JAVA™, PHP, Perl, HTML, CSS, JavaScript, VBScript, ASPX, Microsoft .NET™ languages such as C#, and/or the like. Computing logic may be compiled into executable programs or written in interpreted programming languages. Generally, functionality described herein can be implemented as logic modules that can be duplicated to provide greater processing capability, merged with other modules, or divided into submodules. The computing logic can be stored in any type of computer-readable medium (e.g., a non-transitory medium such as a storage medium) or computer storage device and be stored on, read, and executed by one or more general-purpose or special-purpose processors.

Figure 1:
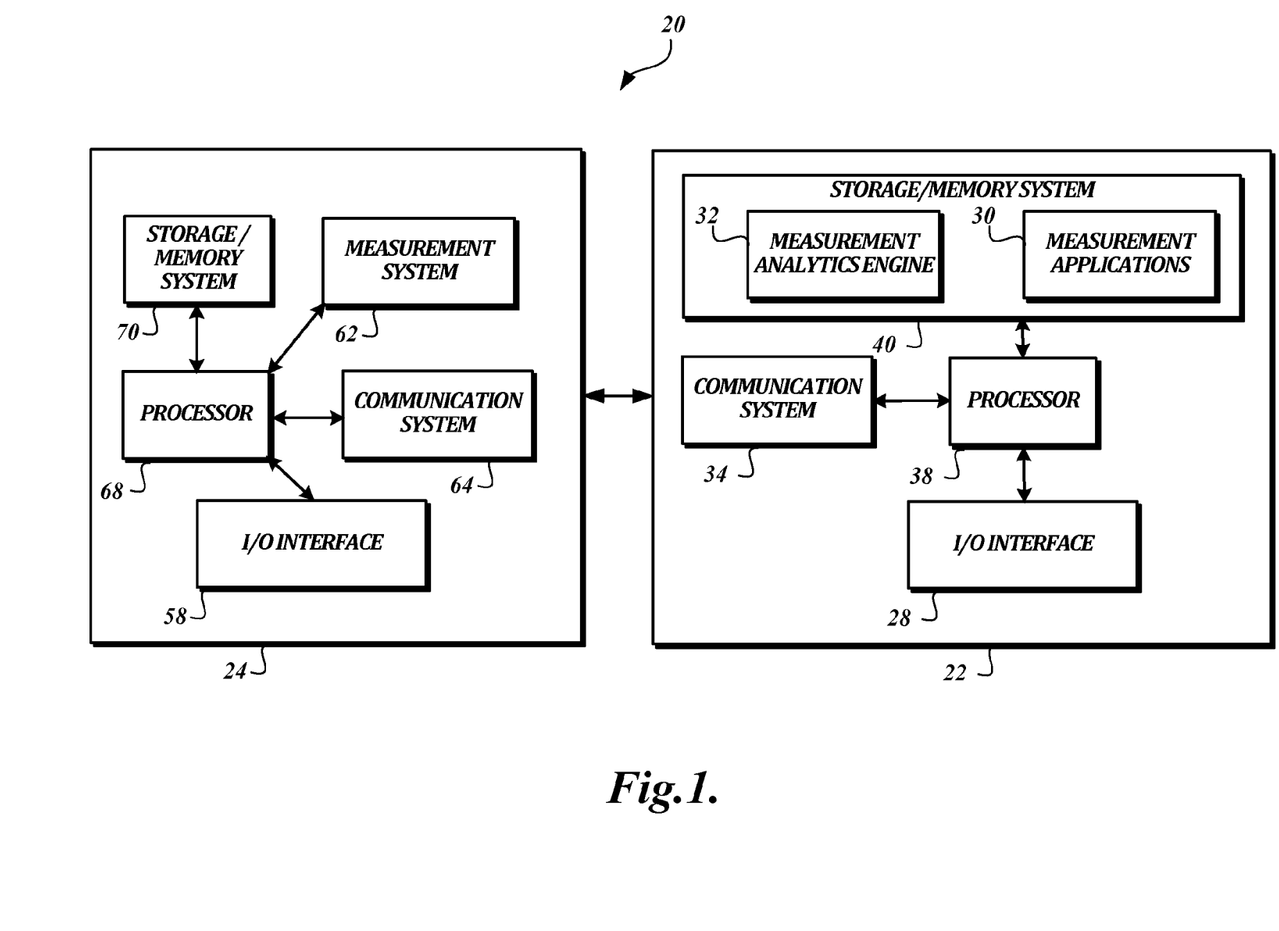
FIG. 1 is a schematic of a system comprising an analytical gateway device in communication with a measurement device in accordance with one or more embodiments of the present disclosure.

FIG. 1 depicts an example analytical gateway device 22 in communication with a measurement device 24. In the example shown in FIG. 1, the analytical gateway device 22 is generally configured to receive measurement data from the measurement device 24. In that regard, the gateway device 22 may be configured to receive measurement data corresponding to at least one electrical or mechanical parameter, including, but not limited to voltage, current, vibration, resistance, capacitance, inductance, frequency, and any calculated value derived from a primary electrical or mechanical measurement. The measurement device 24 may be configured to measure other parameters including, but not limited to, temperature, relative humidity, decibels, magnetic field, flow velocity, moisture, rotations per minute, pressure, distance, light, contact infrared, and any calculated value derived from a primary measurement, such as wattage, power quality, crest factor, and duty cycle. Although only one measurement device 24 is shown in FIG. 1 for ease of illustration, the gateway device 22 may be configured for communication with multiple measurement devices.

The components of the gateway device 22 and the measurement device 24 will now be described in greater detail with reference to FIG. 1. The gateway device 22 includes an input/output (I/O) interface 28 (including, for example, a display for output and a keypad or other input device for user input), a communication system 34, a processor 38, and a storage/memory system 40. The measurement device 24 also includes an input/output (I/O) interface 58 (including, for example, a display for output and a keypad or other input device for user input), a communication system 64, a processor 68, and a storage/memory system 70, along with a measurement system 62 for taking measurements. As shown, the gateway device 22 does not include its own measurement system. However, the gateway device 22 also may include its own measurement system for measuring one or more parameters and obtaining measurement data, without departing from the inventive concepts described herein.

The storage/memory systems 40, 70 shown in FIG. 1 may include non-transitory computer-readable storage media in the form of volatile memory (e.g., random access memory ("RAM") or similar memory technology), nonvolatile memory, (e.g., read only memory ("ROM"), EEPROM, flash memory, or similar memory technology), persistent storage (e.g., magnetic or optical disk storage), or some combination. Those of ordinary skill in the art and others will recognize that memory typically stores data and/or program modules that are immediately accessible to and/or currently being operated on by the respective processors 38, 68. In this regard, the respective processors 38, 68 serve as computational centers of their respective devices 22, 24 by supporting the execution of instructions and processing of data (e.g., measurement data) that are stored in the storage/memory systems 40, 70.

For user interaction with the respective devices 22, 24, the I/O interfaces 28, 58 may include a variety of components that enable the processor 38 to obtain inputs from and provide outputs to a user and/or other components in the system 20. The I/O interfaces 28, 58 may include output devices such as a display for outputting visual information or a speaker for presenting audio information. The I/O interfaces 28, 58 may include input devices such as a keypad, hard or soft keyboards, a touchpad, physical buttons, a scroll wheel, a digital pen, a trackball, a joystick, etc. Some devices may include both input and output capabilities. For example, a display may be configured as a touchscreen that can also accept touch input.

In any of the examples described herein, the described systems (e.g., measurement system 62, communication systems 34, 64) may comprise multiple subsystems. The subsystems that are included can vary depending on implementation. For example, a digital multimeter device may have multiple subsystems for obtaining measurements of different types of parameters. As another example, communication systems 34, 64 may have multiple subsystems for communicating with each other or other devices via various communication channels, as described in further detail below.

In the example shown in FIG. 1, the storage/memory system 40 of the gateway device 22 includes program modules corresponding to a measurement analytics engine 32 and measurement applications 30 that can be selected based on results obtained from the measurement analytics engine 32. The measurement analytics engine 32 manages output and processing of measurement information by selecting appropriate measurement applications 30. Output can be based on live data, stored data, or some combination. Output is not limited to any particular type of output and may include, for example, display of information such as single readings, graphs of readings over time, comparison graphs, load graphs or studies, histograms, trending graphs, etc. A combination of multiple inputs can produce calculated outputs such as total harmonic distortion (THD) readings or apparent power readings, among others. THD or total harmonic distortion of a signal is defined as the ratio of the sum of the powers of all harmonic components to the power of the fundamental frequency and is used to define the level of harmonic content in alternating signals. VA or volt-ampere is the unit used for the apparent power in an electrical circuit equal to the product of root-mean-square (RMS) voltage and RMS current.

Output also can include other data that is not displayed, such as connection or activation requests, which can be used, for example, to connect to or activate a measurement device if a particular condition, trigger, or event requires the measurement device to begin transmitting measurement data.

The measurement analytics engine 32 can perform analysis such as extracting and analyzing a measurement type (e.g., voltage, current, etc.) from measurement data received from the measurement device 24 in order to select an appropriate measurement application 30. For example, the processor 38 may execute instructions configured to cause the gateway device 22 to display measurement data (e.g., in graphical form) on a display of the gateway device 22 or some other device. The measurement analytics engine 32 can make inferences based on received measurement data. For example, the measurement analytics engine 32 can infer that a user desires to view power information if current and voltage readings are being received, and select an appropriate measurement application 30 for execution.

As used herein, the term "measurement application" is used to refer generally to any program module that can be selected and executed (e.g., on an analytical gateway device or some other device) based on received measurement data. Measurement applications described herein include program modules for deriving information from received measurement data (e.g., calculating minimum, maximum, or average values; calculating power or energy values based on received current and voltage values), displaying received measurement data (or information derived from received measurement data) in various formats (e.g., graphically, numerically, etc.), and the like. Many other measurement applications besides those described herein also may be used.

Although measurement applications 30 are shown as being located in the analytical gateway device 22 in FIG. 1, measurement applications also may be located and/or executed on other devices besides the gateway device. For example, measurement applications can be executed on a computing device such as a laptop computer, tablet computer, or smart phone responsive to a communication from the gateway device. Such a communication may include, for example, measurement data received from one or more measurement devices along with a request to execute a particular measurement application on the computing device.

Figure 2:
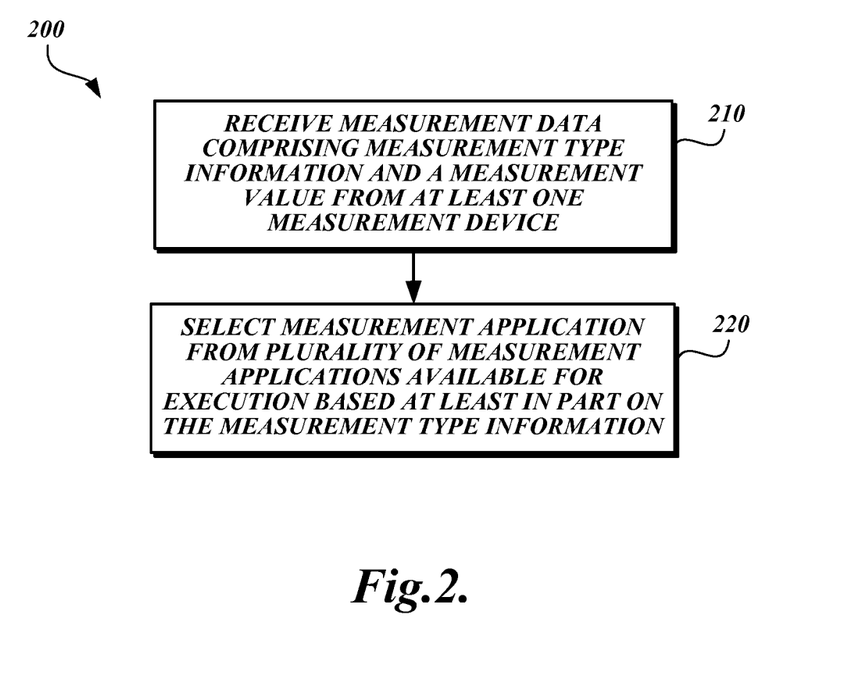
FIGS. 2 and 3 are flowchart diagrams depicting example techniques for selecting measurement applications in accordance with one or more embodiments of the present disclosure.
Figure 3:
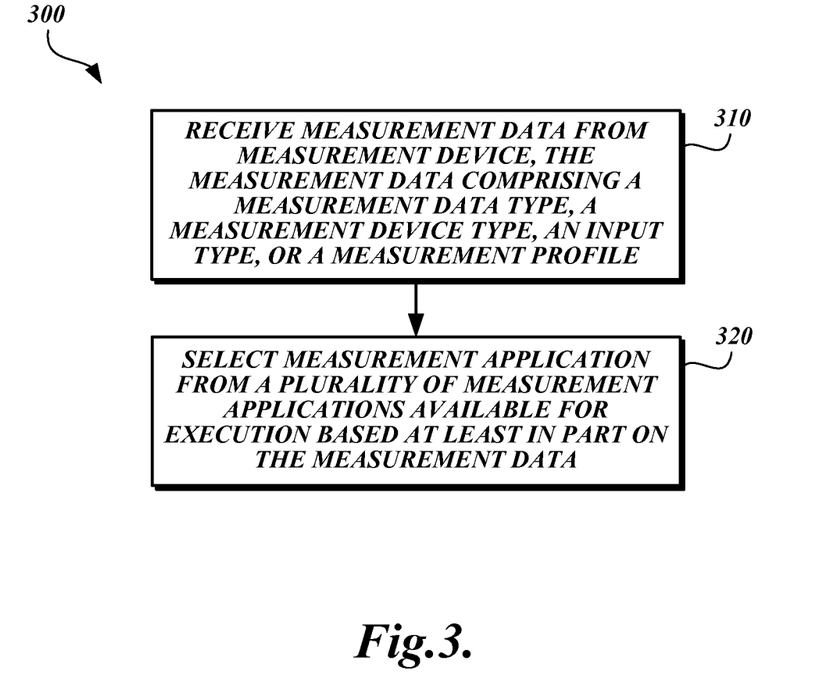

FIGS. 2 and 3 are flow charts showing illustrative techniques 200, 300, respectively, for selecting measurement applications for execution based on measurement data received from measurement devices. The illustrative techniques 200, 300 can be performed by an analytical gateway device (e.g., analytical gateway device 22), as described herein.

In the illustrative technique 200 shown in FIG. 2, at step 210, an analytical gateway device receives measurement data comprising measurement type information (e.g., a representation of a measurement unit such as volts, amps, or the like) and a measurement value from at least one measurement device. At step 220, the gateway device selects a measurement application from a plurality of available measurement applications available for execution based at least in part on the measurement type information. For example, the gateway device may select a measurement application for execution on the gateway device or some other computing device in communication with the gateway device, such a laptop computer, tablet computer, or smart phone. The gateway device may display information associated with the measurement application (e.g., a user interface) on a display of the gateway device or another computing device.

The gateway device may receive additional measurement data from one or more other measurement devices. For example, the gateway device may receive second measurement data comprising second measurement type information and a second measurement value, and perform an operation based at least in part on the second measurement data. The operation may include selection and execution of a second measurement application that differs from a first measurement application that was previously selected. The operation may include displaying information derived from the first measurement and/or the second measurement. For example, if the first measurement type is voltage and the second measurement type is current, the displayed information may include power or energy information derived from current and voltage values. The operation may include a calculation involving the first measurement value and the second measurement value. The calculation may involve calculating a difference between the measurement values and comparing the difference with a predetermined threshold (e.g., a percentage of the first measurement value). Selection of a measurement application may be based at least in part on the calculation.

An analytical gateway device also can select measurement applications based on information other than, or in addition to, measurement data types. In the illustrative technique 300 shown in FIG. 3, at step 310, an analytical gateway device receives measurement data from a measurement device. The measurement data may include a measurement data type (e.g., current, AC voltage, DC voltage, time, temperature, resistance, pressure, flow rate, etc.), a measurement device type (e.g., current measurement device, voltage measurement device, temperature measurement device, resistance measurement device, pressure measurement device, flow measurement device, multimeter, etc.), an input type (e.g., input with a high or low data rate, an event, a threshold, a trigger (e.g., from an oscilloscope), etc.), or a measurement profile (e.g., a profile associated with a particular user or usage scenario such as Electrical, HVAC, Energy, Power Quality, Process, etc.). At step 320, the gateway device selects a measurement application from a plurality of measurement applications available for execution based at least in part on the measurement data. For example, an event associated with a measurement value that exceeds or falls below a predetermined threshold may cause the gateway device to select a measurement application that illustrates the event (e.g., in the form of a graph). As another example, an indication of a Power Quality profile may cause the gateway device to select a measurement application that shows power quality characteristics.

Detailed Examples

Figure 4:
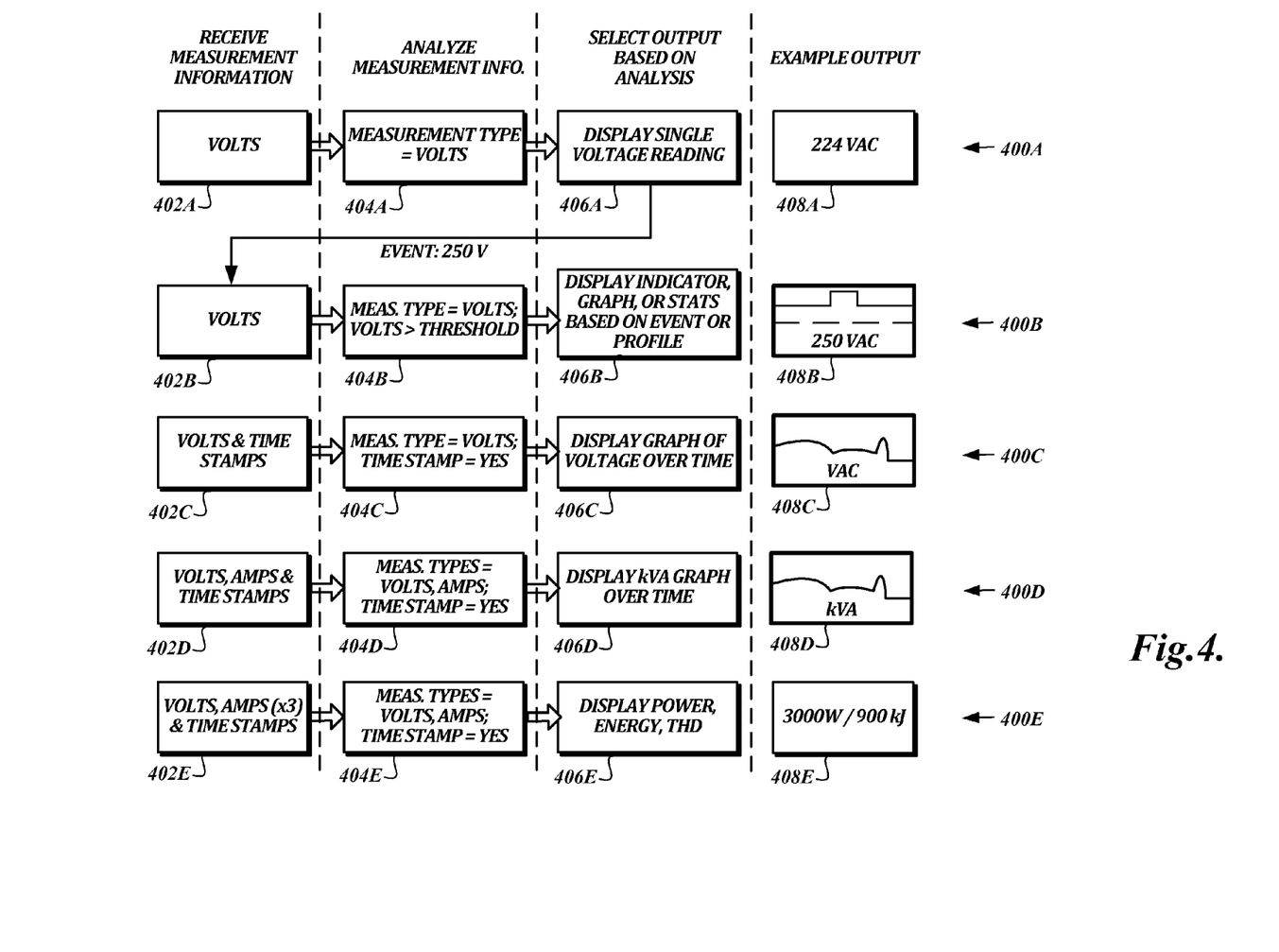
FIG. 4 is a flowchart diagram depicting various example processes for selecting measurement applications to generate different output responsive to different measurement types measurement in accordance with one or more embodiments of the present disclosure.

FIG. 4 is a flow diagram illustrating several examples of processes 400A-E in which a measurement analytics engine can be used to analyze measurement data received from one or more measurement devices and select an appropriate an measurement application for execution. FIGS. 5-8 illustrate example usage scenarios for a system 120 comprising an analytical gateway device 122 that communicates with a plurality of measurement devices 124 via communication channels 142 (e.g., wireless communication channels). The system 120 can be used to perform processes similar to processes 400A-E shown in FIG. 4.

In the examples shown in FIGS. 5-8, the measurement devices 124 are digital multimeter (DMM) measurement devices that combine one or more measurement functions in one unit. As a non-limiting example, the measurement devices 124 may be capable of taking measurements of different types, such as DC voltage, AC voltage, resistance, continuity, and AC current. Alternatively, the gateway device 122 may instead receive measurement data from other measurement devices such as temperature modules, clamp meters, or flexible current probe meters.

In the examples shown in FIGS. 5-8, the I/O interface of the gateway device 122 includes a keypad 180 with buttons for various different functions, including scroll button 188 and "select" button 186, which can be used to navigate a user interface by scrolling through items and making selections. Input devices such as the keypad 180 can be used to allow users to navigate and select displayed measurement information in order to perform more detailed review or analysis of the measurement information (e.g., by reviewing detailed data logs and statistics). The keypad 180 also includes a communication button 184, which can be pressed to enable the gateway device 122 to communicate with one or more other measurement devices.

The gateway device 122 also includes a display 130. The display 130 is configured to respond to measurement applications executing on the gateway device 122 by, for example, displaying measurement data received from the measurement devices 124, or display information derived from the received measurement data.

Referring again to FIG. 4, in process 400A, a voltage measurement is received at step 402A. The measurement analytics engine identifies the measurement type as "voltage" at step 404A and selects a measurement application at step 406A based on the measurement type. In this example, the measurement application is a program module the displays a single voltage reading, as shown in the example output 408A. In the example shown in FIG. 5, the display 130 of the gateway device 122 includes a measurement value and a measurement type indication (reading, respectively, "224.0" and "V AC") associated with a measurement device.

Figure 5:
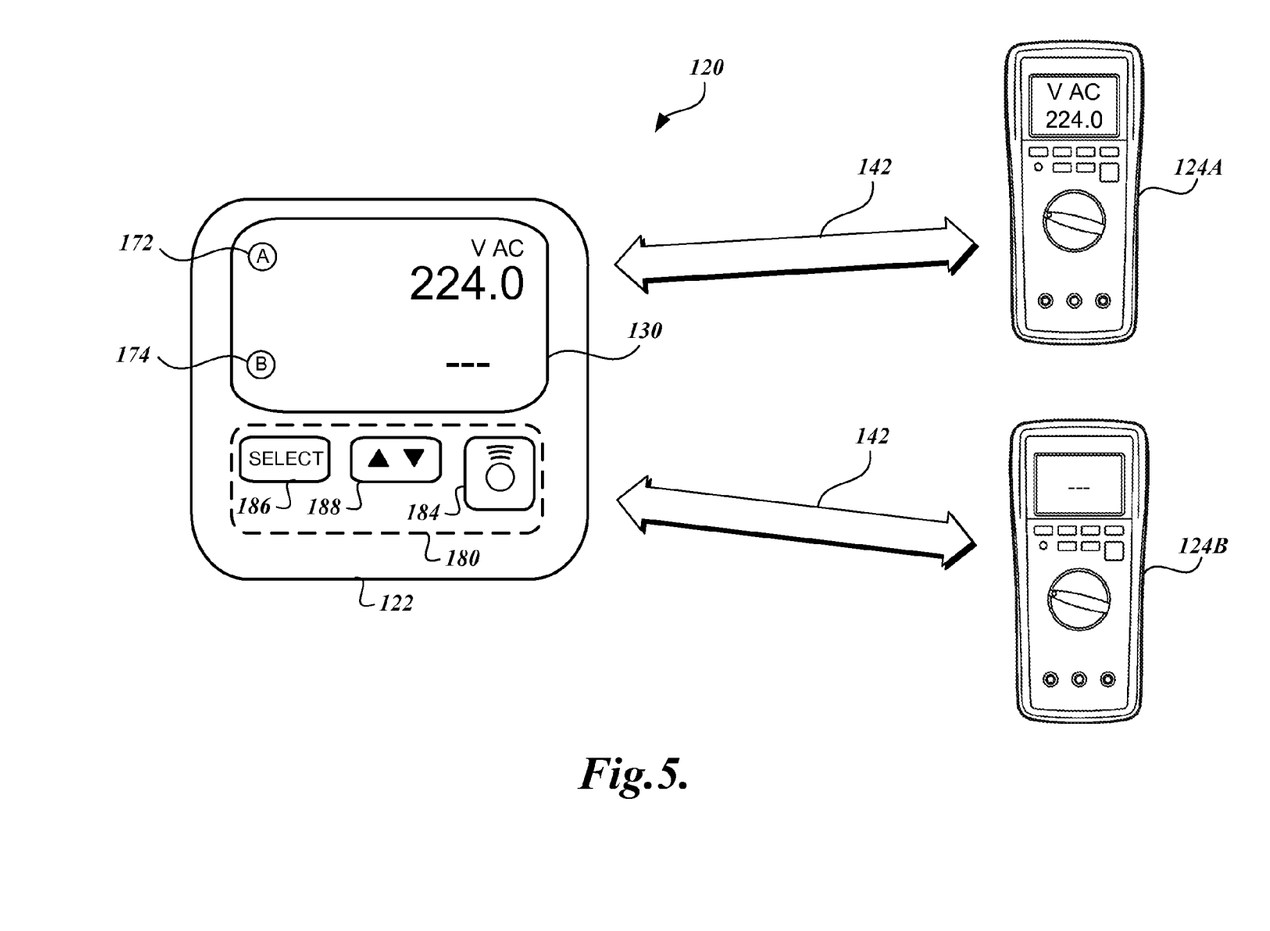
FIGS. 5-8 are schematics of an analytical gateway device in communication with multiple measurement devices in various usage scenarios in accordance with one or more embodiments of the present disclosure.
Figure 6:
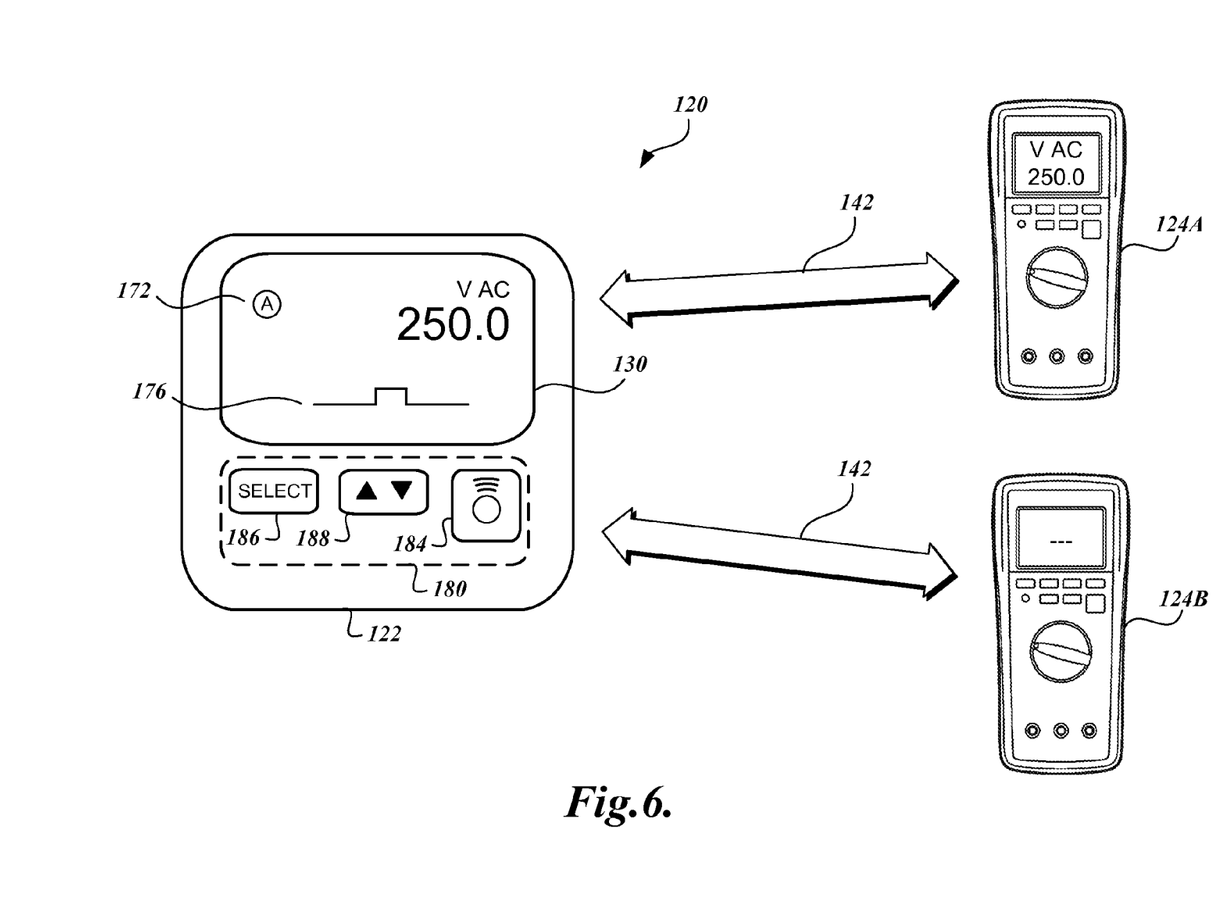
Figure 7:
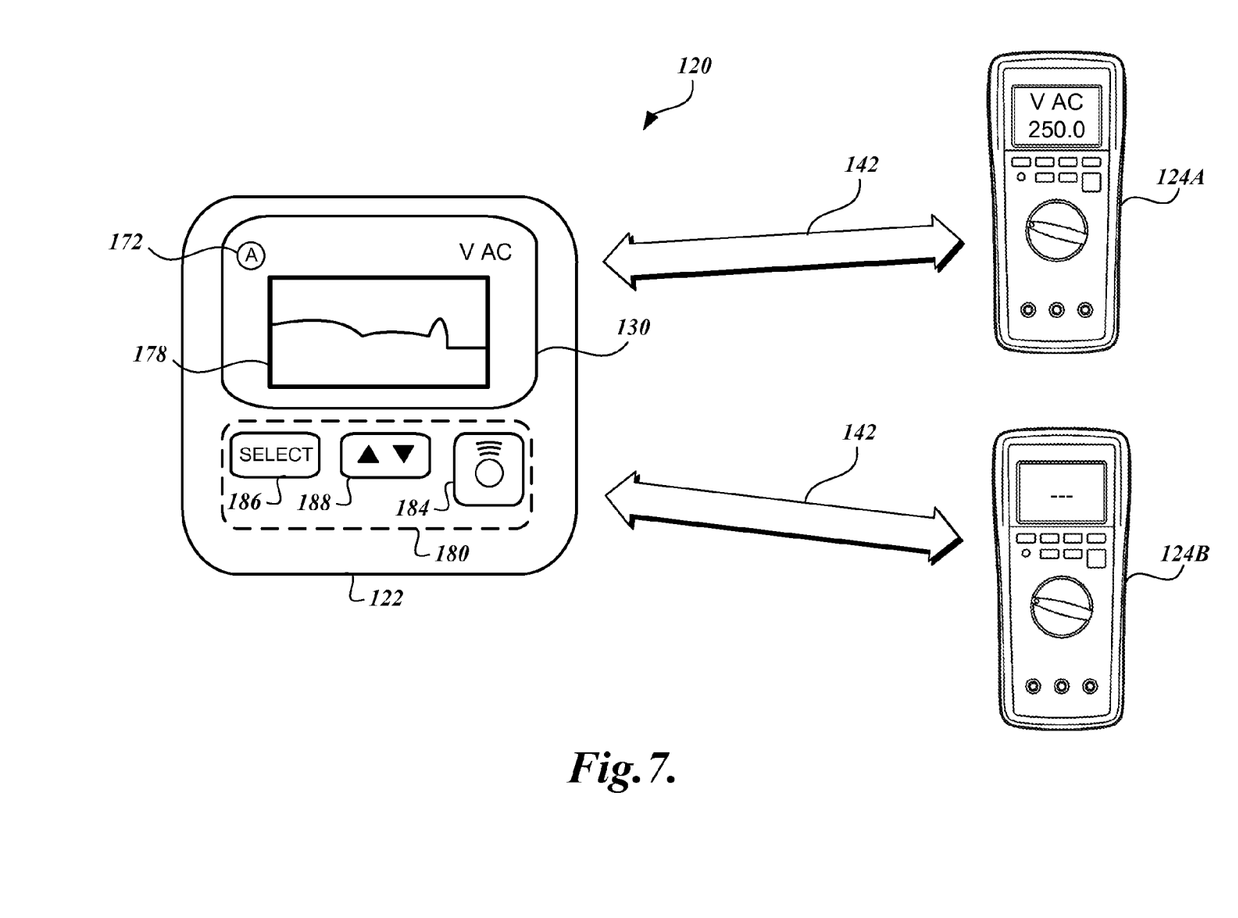
Figure 8:
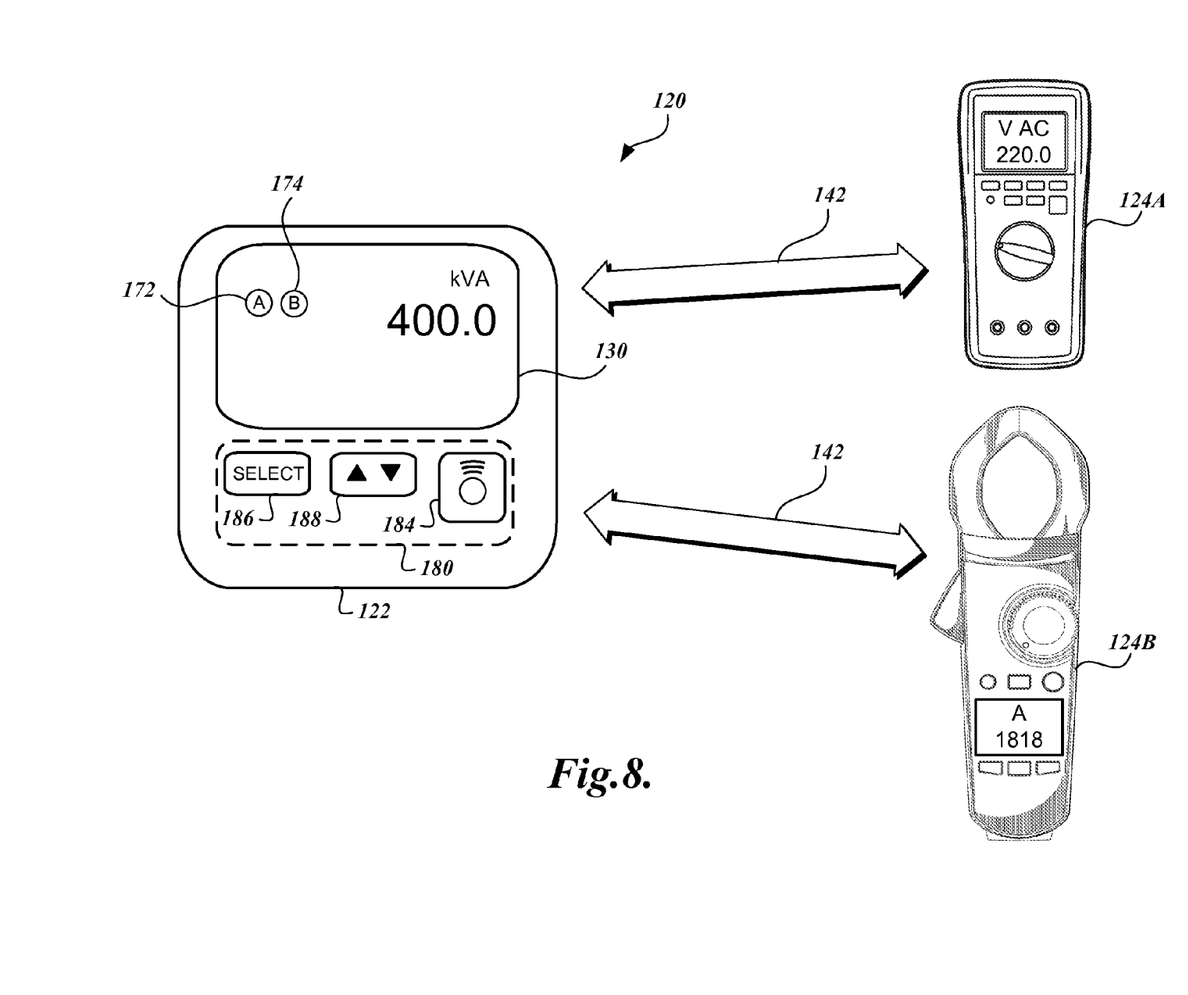

Identifiers 172, 174 can be used to indicate the measurement devices 124A, 124B that are in communication with the gateway device 122. In FIG. 5, the display 130 shows an indicator 172 that indicates that measurement device "A" is providing the voltage reading. The display 130 also shows an indicator 174 that indicates that measurement device "B" is in communication with gateway device 122, but a dashed line indicates that measurement device "B" is not currently providing any measurement data. The dashed line may be replaced (e.g., with a measurement value and a measurement type indication) if measurement data is later received from measurement device "B."

The output of an analytical gateway device (e.g., gateway device 122) may be dynamically updated in response to a variety of events. For example, if a particular measurement event occurs (e.g., if a measurement value exceeds or falls below a predetermined threshold), the display may be updated to provide information that describes the event.

Referring again to FIG. 4, in process 400B, a voltage measurement is received at step 402B. As indicated by an arrow from step 406A to step 402B, the voltage measurement received at step 402B follows the initial voltage measurement (224 V AC) received in step 402A. The measurement analytics engine identifies the measurement type of this new measurement as "voltage" at step 404B, and also determines that the new measurement value (250 V AC) exceeds a predetermined threshold (e.g., 5% more than the previous reading). The measurement analytics engine selects a measurement application at step 406B based on the results of step 404B. In this example, the measurement application is a program module the displays the new voltage reading along with a graphical indication that the new reading exceeds the predetermined threshold, as shown in the example output 408B. In the example shown in FIG. 6, the display 130 of the gateway device 122 has been updated with a new view mode that shows the new voltage reading (250.0) along with a graphical indicator 176 that indicates the voltage increase.

In addition to being responsive to specific events, the output of an analytical gateway device may be configured to more generally show fluctuations in measurement values over time. Referring again to FIG. 4, in process 400C, voltage measurements and associated time stamps are received at step 402C. The measurement analytics engine identifies the measurement type of this new measurement as "volts" at step 404C and also identifies associated time stamps. The measurement analytics engine selects a measurement application at step 406C based on the results of step 404C. In this example, the measurement application is a program module the displays a graph of voltage readings over time, as shown in the example output 408C. In the example shown in FIG. 7, the display 130 of the gateway device 122 is shown in a view mode that includes a graph 178 of voltage readings over time.

An analytical gateway device also may be configured to derive information from received measurement data. Referring again to FIG. 4, in process 400D, voltage measurements, current measurements (amps), and associated time stamps are received at step 402D. In process 400E, voltage measurements, current measurements (amps) from three different sources, and associated time stamps are received at step 402E. The measurement analytics engine identifies the measurement types and also identifies associated time stamps at steps 404D and 404E, respectively, and the measurement analytics engine selects measurement applications at steps 406D and 406E, respectively.

In process 400D, the measurement application derives a new value (e.g., kVA (power)) from the received voltage and current values and displays a graph of kVA readings over time, as shown in the example output 408D. In process 400E, the measurement application derives new values (e.g., 900 kJ (energy) and 3000 W (power)) from the received voltage and current values, as shown in the example output 408E. In the example shown in FIG. 8, the display 130 of the gateway device 122 is shown in a view mode that presents a kVA reading (400.0) based on a voltage measurement (220.0 V AC) and a current measurement (1818 A) received from measurement devices 124A and 124B, respectively. The indicators 172, 174 indicate that the kVA value is derived from information received from measurement devices 124A and 124B.

Many alternatives to the processes, user interfaces, and display states shown in FIGS. 4-8 are possible. For example, the presence of particular data in received measurement data does not necessarily require all analytical gateway devices to respond in the same way. If an analytical gateway device that lacks graphing output capability receives time stamps along with measurement values, the gateway device may ignore the time stamps for the purpose of selecting an appropriate measurement application or view mode. As another example, the display 130 can be configured to include measurement values and measurement types that correspond to measurements from any number of measurement devices. As another example, other graphs (e.g., load graphs) can be displayed instead of or in addition to the example graphs shown in FIGS. 4-8.

The display 130 may also be configured to include other information not shown in FIGS. 5-8, such as risk of danger, data transmission status, battery status, location information (e.g., a location of the analytical gateway device 122 as detected by a GPS unit), etc. Such additional information can also be used by the analytical gateway device in selecting measurement applications. For example, if location information is available, a measurement application with mapping functionality could be selected. As another example, if battery status information is available and indicates a low battery status, a measurement application that uses less power could be selected.

In one illustrative usage scenario, an analytical gateway device can select a measurement application to at least partially control one or more measurement devices. For example, three measurement devices are configured to provide amperage measurements for a three-phase power system. An analytical gateway device is configured for communication with the three measurement devices. The analytical gateway device receives amperage input from the first measurement device, which provides amperage readings for Phase A while the other two measurement devices (for Phases B and C) are in a low-power state. The gateway device detects a change in amperage in Phase A that exceeds or falls below a preset threshold. In response, the gateway device causes the two measurement devices for Phases B and C to enter an active state (e.g., by sending control messages that can be recognized and processed by the measurement devices) and updates a display on the gateway device to show measurement information received from all three measurement devices. The ability of the gateway device to select the appropriate measurement application and activate measurement devices provides several advantages, including conservation of battery life in the respective measurement devices and the ability to display more relevant information to a user. Depending on program design and/or implementation, tasks such as activation of measurement devices and display of relevant information could be performed by a single measurement application or by multiple measurement applications.

According to an illustrative data format, measurement data (or logging data) is contained in payload sections of data packets, which may include a logging header record and zero or more logging detail records. The data packets are generated by measurement devices and can be transmitted to other devices, such as an analytical gateway device, for further processing. In accordance with examples described herein, data in the packet payload sections can be used by an analytical gateway device to select one or more appropriate measurement applications, among other possible uses.

In this illustrative data format, the logging header record includes several data fields, such as a 1-byte field that identifies the record as a logging header record, a 1-byte field that indicates a primary unit of measure in the logging detail records, a 2-byte field that indicates how often detail records were saved, two 4-byte fields that indicate start and stop times (POSIX real-time clock values) for the logging session, and a 4-byte field that indicates the number of bytes in the logging detail records that follow. In the logging detail records fields, magnitudes are specified in 1-byte fields called attribute fields, and readings (with decimal points removed) are specified in 2-byte reading fields (e.g., maximum, minimum, and average reading fields). Other information (e.g., timestamps for minimum and maximum values) also can be included in the logging detail records.

Example decimal values for various possible base units of measure (neglecting the many possible metric prefixes, such as "mega" or "milli") are shown in Table 1 below.

TABLE 1

Decimal values for illustrative measurement units

| Value | Unit |
| --- | --- |
| 0 | None |
| 1 | VAC |
| 2 | VDC |
| 3 | AAC |
| 4 | ADC |
| 5 | Hz |
| 6 | % RH |
| 7 | Degrees Celsius |
| 8 | Degrees Fahrenheit |
| 9 | Degrees Rankine |
| 10 | Kelvin |
| 11 | Ohms |
| 12 | Siemens |
| 13 | % Duty |
| 14 | Seconds |
| 15 | Farads |
| 16 | dB |
| 17 | dBm |
| 18 | Watts |
| 19 | Joule |
| 20 | Henry |
| 21 | psi |
| 22 | meters Hg |
| 23 | inches Hg |
| 24 | feet Water |
| 25 | meters Water |
| 26 | inches Water |
| 27 | inches Water at 60 F. |
| 28 | bar |
| 29 | Pascals |
| 30 | g/cm_squared |

Figure 9:
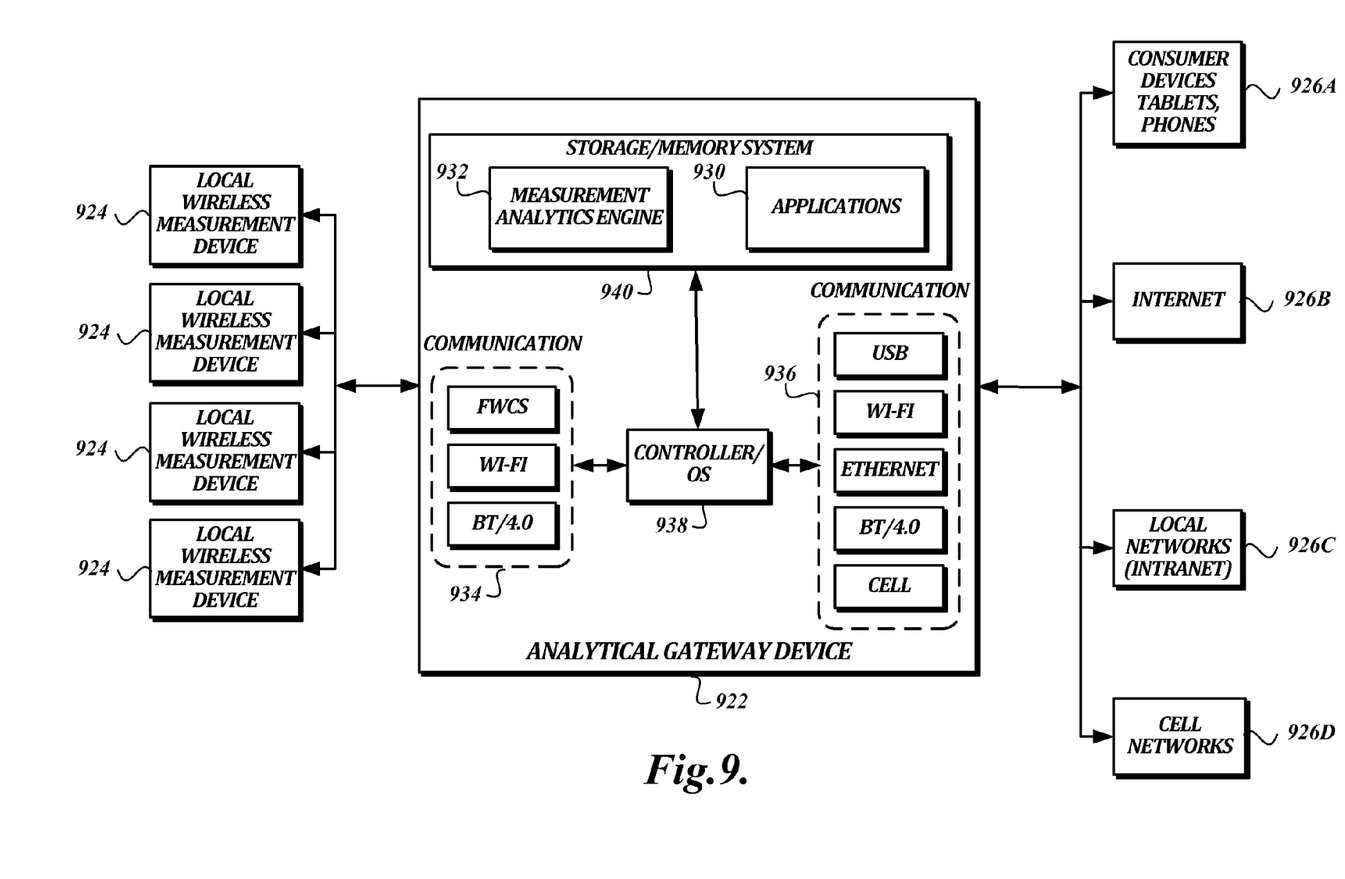
FIG. 9 is a detailed schematic of an analytical gateway device in communication with a plurality of measurement devices and one or more other computing devices in accordance with one or more embodiments of the present disclosure.

Referring to FIG. 9, an illustrative system including an analytical gateway device 922 in wireless communication with a plurality of wireless-enabled local measurement devices 924 is illustrated. The gateway device 922 is also configured for communication with other computing devices via direct (e.g., USB) connections 926A or network connections 926B-D. In the example shown in FIG. 9, a first communication system 934 includes modules for communicating with measurement devices 924 according to different communication protocols (e.g., Wi-Fi, FWCS, and Bluetooth communication modules). A second communication system 936 includes modules for communicating with other computing devices 924 via direct connections 926A or network connections 926B-D according to different communication protocols (e.g., USB, Wi-Fi, Ethernet, Bluetooth, and cellular communication modules). The communication systems 934, 936 are only examples, and need not include all of the modules shown. Further, the communication systems 934, 936 may be combined into a single communication system, or individual modules shown in these communication systems may be combined. For example, a single Wi-Fi or Bluetooth module may be used for dual-mode communication, that is, communication with both measurement devices 924 and other computing devices. Depending on configuration, the gateway device 922 also can access a Wi-Fi hotspot to facilitate wireless communication with other devices.

The storage/memory system 940 includes program modules corresponding to a measurement analytics engine 932 and measurement applications 930 that can be selected based on results obtained from the measurement analytics engine 932. Although measurement applications 930 are shown as being located in the analytical gateway device 922 in FIG. 9, measurement applications also may be located and/or executed on other devices besides the gateway device. For example, measurement applications can be executed on a computing device such as a laptop computer, tablet computer, or smart phone responsive to communications from the gateway device 922 via connections 926A-D. Such a communication may include, for example, a request to execute a particular measurement application on the computing device, along with measurement data.

In the example shown in FIG. 9, a controller 938 executes an operating system (OS) that manages the applications 930, the measurement analytics engine 932, and overall device functionality. The gateway device 922 also may include an input/output (I/O) interface (not shown in FIG. 9), which may include, for example, a display for output and a keypad or other input device for user input.

In one possible configuration, a system comprising an analytical gateway device (e.g., analytical gateway device 922) and one or more measurement devices can be configured as a full-featured, wireless measurement data logging and processing system. For example, the gateway device 922 can connect to and even control (e.g., when acting as a master device) wireless modules (measurement devices) using proprietary (e.g., the Fluke Wireless Communication Standard (FWCS) maintained by Fluke Corporation) or publicly used wireless communication protocols. The measurement devices can be synchronized (e.g., using real time clock information, remote triggers, events, etc.).

The gateway device 922 can log readings by storing data received from the wireless modules, which can continuously stream data to the gateway device at a fixed or variable transmission rate. In turn, the gateway device 922 can stream data (e.g., live data, stored data, or some combination) to consumer devices via direct connections or network connections. In this way, the gateway device 922 can act as a server for delivery of some types of information to client devices, which can allow for remote monitoring of measurement data, including providing remote alarms to alert remote users to unexpected and/or unsafe conditions.

Extensions and Alternatives

Many alternatives to the systems and devices described herein are possible. Although some examples in the present disclosure include descriptions of devices comprising specific hardware components in specific arrangements, techniques and tools described herein can be modified to accommodate different hardware components, combinations, or arrangements. Further, although some examples in the present disclosure include descriptions of specific usage scenarios, techniques and tools described herein can be modified to accommodate different usage scenarios.

Many alternatives to the user interfaces described herein are possible. In practice, the user interfaces described herein may be implemented as separate user interfaces or as different states of the same user interface, and the different states can be presented in response to different events, e.g., user input events. The elements shown in the user interfaces can be modified, supplemented, or replaced with other elements in various possible implementations.

In addition, many alternatives to the techniques described herein are possible. For example, processing stages in the various techniques can be separated into additional stages or combined into fewer stages. As another example, processing stages in the various techniques can be omitted or supplemented with other techniques or processing stages. As another example, processing stages that are described as occurring in a particular order can instead occur in a different order. As another example, processing stages that are described as being performed in a series of steps may instead be handled in a parallel fashion, with multiple modules or software processes concurrently handling one or more of the illustrated processing stages. As another example, processing stages that are indicated as being performed by a particular device or module may instead be performed by one or more other devices or modules.

While various illustrative embodiments have been illustrated and described, it will be appreciated that changes can be made therein without departing from the spirit and scope of the invention.

The invention claimed is:

1. A method comprising:
by a gateway device, receiving first measurement data from a first measurement device, wherein the first measurement data comprises first measurement type information and a first measurement value, and detecting an event based on a comparison of the first measurement value or a value derived therefrom to a threshold; and by the gateway device, selecting a first measurement application from a plurality of measurement applications available for execution based at least in part on the first measurement type information and the detected event, wherein, in response to the detected event, the selected first measurement application controls one or more measurement devices including a second measurement device different from the first measurement device.

2. The method of claim 1, wherein the first measurement type information comprises a representation of a first measurement unit associated with the first measurement value.

3. The method of claim 1, the method further comprising presenting a user interface associated with the first measurement application on a display of the gateway device.

4. The method of claim 1, the method further comprising displaying information associated with the first measurement application on a display of a computing device.

5. The method of claim 1, wherein the second measurement device is in a low-power state, and wherein said control includes activating the second measurement device to enter an active state in which the gateway device receives second measurement data from the second measurement device, the method further comprising:
   by the gateway device, receiving the second measurement data comprising a second measurement value; and
   by the gateway device, performing an operation based at least in part on the second measurement data.

6. The method of claim 5, wherein the operation comprises execution of a second measurement application that differs from the first measurement application.

7. The method of claim 5, wherein the operation comprises displaying information derived from the first measurement data and the second measurement data.

8. The method of claim 5, wherein the second measurement data further comprises second measurement type information, and wherein the operation is performed based at least in part on the second measurement type information.

9. The method of claim 8, further comprising, by the gateway device, determining a second measurement type for the second measurement data based at least in part on the second measurement type information, wherein the second measurement type differs from the first measurement type.

10. The method of claim 9, wherein the first measurement type is voltage, wherein the second measurement type is current, and wherein the displayed information comprises power or energy information.

11. The method of claim 5, wherein the operation comprises a calculation involving the first measurement value and the second measurement value.

12. The method of claim 11, further comprising selecting a second measurement application from the plurality of measurement applications available for execution based at least in part on the calculation.

13. The method of claim 11, wherein the calculation comprises comparing a difference between the first measurement value and the second measurement value with a predetermined threshold.

14. The method of claim 1, further comprising executing the first measurement application on the gateway device.

15. The method of claim 1, further comprising executing the first measurement application on a computing device in communication with the gateway device.

16. The method of claim 1, wherein the selecting is based at least in part on a measurement data type selected from the group consisting of: current, AC voltage, DC voltage, time, temperature, resistance, pressure, and flow rate.

17. The method of claim 1, wherein the selecting is based at least in part on a measurement device type selected from the group consisting of:
   current measurement device, voltage measurement device, temperature measurement device, resistance measurement device, pressure measurement device, flow measurement device, and multimeter.

18. The method of claim 1, wherein the selected measurement application is configured to permit at least partial control by the gateway device of the first measurement device.

19. The method of claim 18, wherein the at least partial control of the first measurement device comprises initiating a transition of the respective measurement device from a low-power state to an active state.

20. A system comprising:
   a plurality of measurement devices; and
   a gateway device comprising:
      a wireless communication system configured to receive data from the plurality of measurement devices;
      a processor; and
      one or more computer-readable media having stored therein computer-executable instructions configured to cause the gateway device to:
         receive first measurement data from a first measurement device, wherein the first measurement data comprises first measurement type information and a first measurement value;
         detect an event based on a comparison of the first measurement value or a value derived therefrom to a threshold; and
         select a first measurement application from a plurality of measurement applications available for execution based at least in part on the first measurement type information and the detected event,
      wherein, in response to the detected event, the selected first measurement application controls one or more measurement devices of the plurality of measurement devices including a second measurement device different from the first measurement device.

21. The system of claim 20, wherein at least one of the measurement devices comprises a digital multimeter device.

22. The system of claim 20, wherein the second measurement device is in a low-power state, and wherein said control includes activating the second measurement device to enter an active state in which the gateway device receives second measurement data from the second measurement device.

* * * * *